US012811361B2

(12) United States Patent
Nagata

(10) Patent No.: US 12,811,361 B2

(45) Date of Patent: Nov. 24, 2026

(54) LIGHT-EMITTING DEVICE AND MANUFACTURING METHOD THEREOF

(71) Applicant: SONY SEMICONDUCTOR SOLUTIONS CORPORATION, Kanagawa (JP)

(72) Inventor: Masaya Nagata, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 987 days.

(21) Appl. No.: 18/005,386

(22) PCT Filed: Jul. 14, 2021

(86) PCT No.: PCT/JP2021/026434

§ 371 (c)(1),
(2) Date: Jan. 13, 2023

(87) PCT Pub. No.: WO2022/019188

PCT Pub. Date: Jan. 27, 2022

(65) Prior Publication Data

US 2023/0283042 A1 Sep. 7, 2023

(30) Foreign Application Priority Data

Jul. 21, 2020 (JP) ................................ 2020-124695

(51) Int. Cl.

*H01S 5/02* (2006.01)
*H01S 5/0234* (2021.01)

(Continued)

(52) U.S. Cl.

CPC .......... *H01S 5/0216* (2013.01); *H01S 5/0203* (2013.01); *H01S 5/0234* (2021.01);

(Continued)

(58) Field of Classification Search

CPC .... H01S 5/0216; H01S 5/0203; H01S 5/0234; H01S 5/0237; H01S 5/02253; H01S 5/183; H01S 5/18305; H01S 5/423

See application file for complete search history.

(56) References Cited

U.S. PATENT DOCUMENTS

2002/0094670 A1 7/2002 Maruoka
2004/0209452 A1 10/2004 Kim (Continued)

FOREIGN PATENT DOCUMENTS

CN 102457016 A 5/2012
JP H11186309 A 7/1999

(Continued)

OTHER PUBLICATIONS

International Search Report and Written Opinion prepared by the Japan Patent Office on Aug. 4, 2021, for International Application No. PCT/JP2021/026434, 2 pgs.

*Primary Examiner* — Yuanda Zhang
(74) *Attorney, Agent, or Firm* — SHERIDAN ROSS P.C.

(57) ABSTRACT

Problems when a first pad on a first substrate for outputting a drive signal for driving a light-emitting element is bonded to a second pad on a second substrate having the light-emitting element are prevented. A light-emitting device includes a first substrate that outputs a drive signal for a light-emitting element, and a second substrate that is laminated on the first substrate and includes the light-emitting element. A first surface side of the first substrate includes a first pad that supplies the drive signal to the light-emitting element, a first conductive layer disposed on the first pad, and a bonding layer disposed on the first conductive layer, and a second surface side of the second substrate facing the first surface of the first substrate includes the light-emitting element having a mesa shape, and a second pad that is (Continued)

disposed on the light-emitting element and bonded to the first pad.

20 Claims, 23 Drawing Sheets

(51) Int. Cl.

| | |
|---|---|
| ***H01S 5/0237*** | (2021.01) |
| *H01S 5/02253* | (2021.01) |
| *H01S 5/183* | (2006.01) |
| *H01S 5/42* | (2006.01) |

(52) U.S. Cl.
CPC ........ *H01S 5/0237* (2021.01); *H01S 5/02253* (2021.01); *H01S 5/183* (2013.01); *H01S 5/18305* (2013.01); *H01S 5/423* (2013.01)

(56) References Cited

U.S. PATENT DOCUMENTS

| | | | | |
|---|---|---|---|---|
| 2010/0230810 | A1 | 9/2010 | Kang | |
| 2012/0093185 | A1 | 4/2012 | Shimizu et al. | |
| 2013/0119118 | A1 | 5/2013 | Shimizu et al. | |
| 2019/0252312 | A1* | 8/2019 | Yu | H10H 20/01 |
| 2020/0014169 | A1 | 1/2020 | Yu et al. | |

FOREIGN PATENT DOCUMENTS

| | | |
|---|---|---|
| JP | 2010-199324 | 9/2010 |
| JP | 2012-089578 | 5/2012 |
| JP | 2014-529199 | 10/2014 |
| KR | 20120020765 A | 3/2012 |

* cited by examiner

LIGHT-EMITTING DEVICE AND MANUFACTURING METHOD THEREOF

CROSS REFERENCE TO RELATED APPLICATIONS

This application is a national stage application under 35 U.S.C. 371 and claims the benefit of PCT Application No. PCT/JP2021/026434, having an international filing date of 14 Jul. 2021, which designated the United States, which PCT application claimed the benefit of Japanese Patent Application No. 2020-124695, filed 21 Jul. 2020, the entire disclosures of each of which are incorporated herein by reference.

TECHNICAL FIELD

The present disclosure relates to a light-emitting device and a manufacturing method thereof.

BACKGROUND ART

In recent years, as a type of semiconductor laser, surface emitting lasers such as vertical cavity surface emitting lasers (VCSELs) have attracted attention (see PTL 1). VCSELs have excellent features in that they have low power consumption, can be mass-produced at a low cost, and can also be easily formed into two-dimensional arrays. In particular, since back emission type VCSELs do not require wire bonding and can be directly connected to a laser diode driver (LDD) substrate or a single photon avalanche diode (SPAD) substrate, miniaturization and multifunctionality can be easily realized.

CITATION LIST

Patent Literature

[PTL 1]
Japanese Translation of PCT Application No. 2014-529199

SUMMARY

Technical Problem

When a VCSEL chip is connected to an LDD substrate or the like, a method in which a bonding member such as solder is formed on a pad on an upper surface of a mesa-shaped light-emitting element formed in the VCSEL chip, and then the LDD substrate or the like is bonded thereto is adopted.

However, as miniaturization progresses, the pad of the mesa-shaped light-emitting element becomes smaller, and a distance (pitch) between adjacent light-emitting elements also becomes smaller. For this reason, it becomes difficult to form the bonding member on the pad in a well-positioned manner, and in some cases, a formation position of the bonding member is misaligned, and thus a problem that pads of adjacent light-emitting elements are short-circuited via the bonding member may also occur.

Thus, the present disclosure provides a light-emitting device that can prevent a problem when a first pad on a first substrate that outputs a drive signal for driving a light-emitting element and a second pad on a second substrate that has the light-emitting element are bonded together, and a manufacturing method thereof.

Solution to Problem

In order to solve the above problems, according to the present disclosure, provided is a light-emitting device including: a first substrate that outputs a drive signal for driving a light-emitting element; and a second substrate that is laminated on the first substrate and includes the light-emitting element, wherein a first surface side of the first substrate includes:

a first pad that supplies the drive signal to the light-emitting element;

a first conductive layer disposed on the first pad; and a bonding layer disposed on the first conductive layer, and a second surface side of the second substrate disposed to face the first surface of the first substrate includes:

the light-emitting element having a mesa shape; and a second pad that is disposed on the light-emitting element and bonded to the first pad via the bonding layer.

The second surface side of the second substrate may include a second conductive layer that is disposed on the second pad and bonded to the bonding layer.

The first conductive layer may be a barrier layer for the bonding layer, and the bonding layer may include three or more metal layers sandwiching a nickel layer, or two or more metal layers including a nickel layer.

According to the present disclosure, provided is a method for manufacturing a light-emitting device including: forming an insulating film on a first surface of a first substrate including a surface of a first pad that outputs a drive signal for driving a light-emitting element;

exposing an upper surface of the first pad by patterning the insulating film;

forming a first conductive layer on the insulating film and the first pad;

forming a bonding layer on the first conductive layer;

reflowing the bonding layer; and causing the first surface of the first substrate to face a second surface of a second substrate and bonding the first pad to a second pad electrically connected to an anode electrode of the light-emitting element having a mesa shape formed on the second substrate via the bonding layer.

The method may further include forming a resist film on the first conductive layer after forming the first conductive layer on the first pad, patterning the resist film such that the first conductive layer above the first pad is exposed, forming the bonding layer on the exposed first conductive layer, and removing the resist film.

The method may further include removing a portion of the first conductive layer after removing the resist film, and the reflowing of the bonding layer may be performed after removing the portion of the first conductive layer.

The removing of the portion of the first conductive layer may be performed by wet etching.

The first pad may contain aluminum, and the first conductive layer may be a laminated film of titanium and copper.

In the forming of the first conductive layer, a metal layer containing titanium may be formed on the first pad and a metal layer containing copper may be formed thereon, and the bonding layer may be formed on the metal layer containing copper.

The bonding layer may be a laminated film containing at least one of tin and copper.

The bonding layer may be formed of three or more metal layers sandwiching a nickel layer, or two or more metal layers including a nickel layer.

The bonding layer may be formed by laminating a first metal layer containing copper on the first conductive layer, laminating a second metal layer containing nickel on the first metal layer; and laminating a third metal layer containing tin on the second metal layer.

The bonding layer may be formed by laminating a first metal layer containing nickel on the first conductive layer and laminating a second metal layer containing tin on the first metal layer.

The method may further include forming a second conductive layer on the second pad of the second substrate, and causing the first surface of the first substrate to face the second surface of the second substrate and bonding the bonding layer of the first substrate to the second conductive layer.

A diameter size of the second conductive layer may be equal to or larger than a diameter size of the bonding layer.

The first substrate may be a wafer, and chip on wafer (CoW) connection may be performed in the bonding of the bonding layer of the first substrate to the second conductive layer.

A plurality of the light-emitting elements having mesa shapes may be formed on the second substrate, the method may further include individualizing the plurality of light-emitting elements after forming the second conductive layer, and the bonding of the bonding layer of the first substrate to the second conductive layer may be performed after individualizing the plurality of light-emitting elements.

The individualizing of the plurality of light-emitting elements may be performed by individualizing the plurality of light-emitting elements by stealth dicing using laser light.

The method may further include injecting an insulating material between the first substrate and the second substrate after bonding the bonding layer of the first substrate to the second conductive layer.

DESCRIPTION OF EMBODIMENTS

Embodiments of a light-emitting device and a manufacturing method thereof will be described below with reference to the figures. Although main components of the light-emitting device and the manufacturing method thereof will be mainly described below, the light-emitting device and the manufacturing method may have components and functions that are not illustrated or described. The following description does not exclude components or functions that are not illustrated or described.

Figure 1:
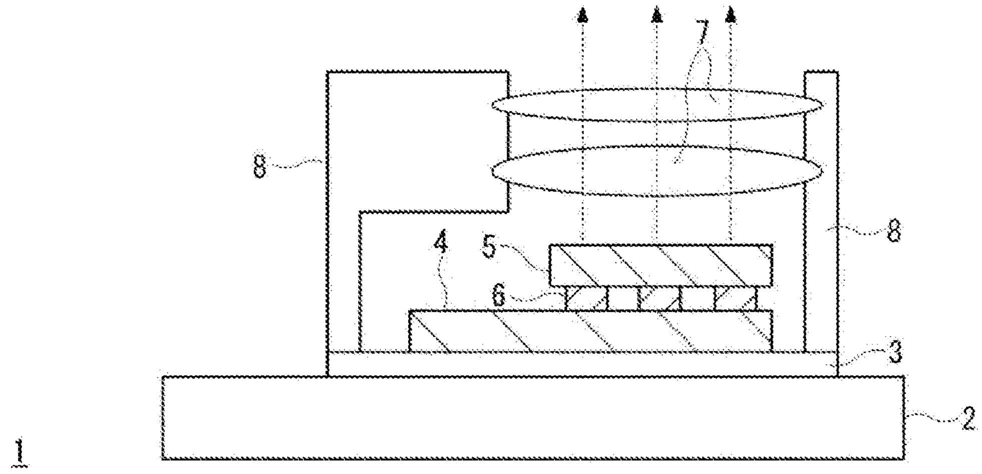
FIG. 1 is a schematic cross-sectional view showing a schematic configuration of a light-emitting device according to one embodiment.

FIG. 1 is a schematic cross-sectional view showing a schematic configuration of a light-emitting device 1 according to one embodiment. As shown in FIG. 1, in the light-emitting device 1 according to the present embodiment, an LDD substrate (a first substrate) 4 is disposed on a mounting substrate 2 via a heat dissipation substrate 3, and a laser diode (LD) chip (a second substrate) 5 is disposed on the LDD substrate 4. The LDD substrate 4 and the LD chip 5 are bonded together with a bonding layer 6 containing a plating material. The LDD substrate 4 outputs drive signals for driving light-emitting elements to the LD chip 5 via the bonding layer 6. The LD chip 5 has the light-emitting elements. The light-emitting elements emit laser light in a predetermined wavelength band in accordance with the drive signals from the LDD substrate 4. The laser light emitted from the LD chip 5 is radiated to the outside through a correction lens 7. The correction lens 7 is held by a lens holding unit 8. Also, since the correction lens 7 is not an essential member, it may be omitted.

Figure 2:
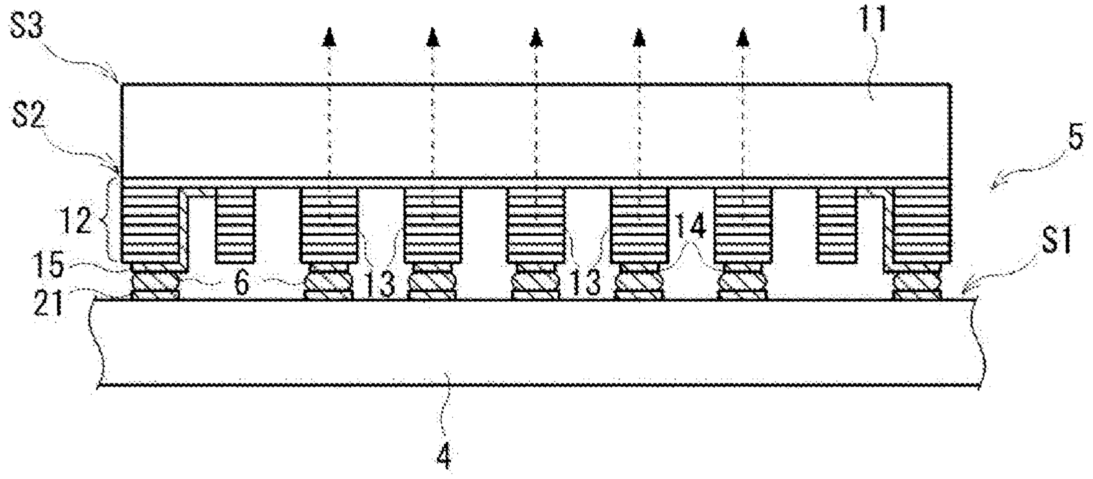
FIG. 2 is a cross-sectional view showing in more detail a structure of an LDD substrate and an LD chip of the light-emitting device of FIG. 1.

FIG. 2 is a cross-sectional view showing in more detail a structure of the LDD substrate 4 and the LD chip 5 of the light-emitting device 1 of FIG. 1. The LD chip 5 includes a substrate 11, a laminated film 12, a plurality of light-emitting elements 13 formed using the laminated film 12, a plurality of anode electrodes 14, and a cathode electrode 15.

The substrate 11 of the LD chip 5 is a substrate made of a compound semiconductor such as gallium arsenide (GaAs). A surface of the substrate 11 facing the LDD substrate 4 is a front surface S2, and laser light is emitted from a rear surface S3 side of the substrate. The laminated film 12 includes a first multilayer reflector, a first spacer layer, an active layer, a second spacer layer, a second multilayer reflector, and the like, and laser light generated in the active layer is resonated between the first multilayer reflector and the second multilayer reflector to improve light intensity and emitted from the rear surface S3 side of the substrate. Thus, the LD chip 5 in FIG. 2 is of a back-illuminated type. In the present specification, the light-emitting element 13 having the layer structure shown in FIG. 2 is referred to as a VCSEL structure.

The plurality of light-emitting elements 13 are formed by machining the laminated film 12 into a mesa shape. The anode electrodes (second pads) 14 are disposed on an upper surface of each light-emitting element 13 when viewed from the substrate 11 side. Similarly, the cathode electrode 15 is disposed on upper and side surfaces of the laminated film 12 disposed on an end portion side of the LD chip 5 when viewed from the substrate 11 side. The cathode electrode 15 is also disposed on the lowermost layer side of the laminated film 12 of the plurality of light-emitting elements 13 when viewed from the substrate 11 side. In FIG. 2, the arrangement of the anode electrodes 14 and the cathode electrode 15 may be reversed. In FIG. 2, the common electrode is the cathode electrode 15, but the common electrode may be the anode electrode 14 and the cathode electrodes 15 may be provided in each mesa portion.

The LDD substrate 4 has a plurality of pads 21 for supplying drive signals to the plurality of light-emitting elements 13 of the LD chip 5. The bonding layer 6 is disposed on these pads 21 as will be described later, and the pads 21 of the LDD substrate 4 and the corresponding pads 14 of the anode electrodes 14 of the LD chip 5 are bonded together via the bonding layer 6. Hereinafter, the pads of the LDD substrate 4 are referred to as the first pads 21 and the pads of the anode electrodes 14 of the LD chip 5 are referred to as the second pads 14.

The LDD substrate 4 may have a drive circuit that generates drive signals. In this case, the LDD substrate 4 performs active driving. Alternatively, the LDD substrate 4 may have a switching circuit for switching drive signals generated by an external drive circuit. In this case, the LDD substrate 4 performs passive driving.

Figure 3A:
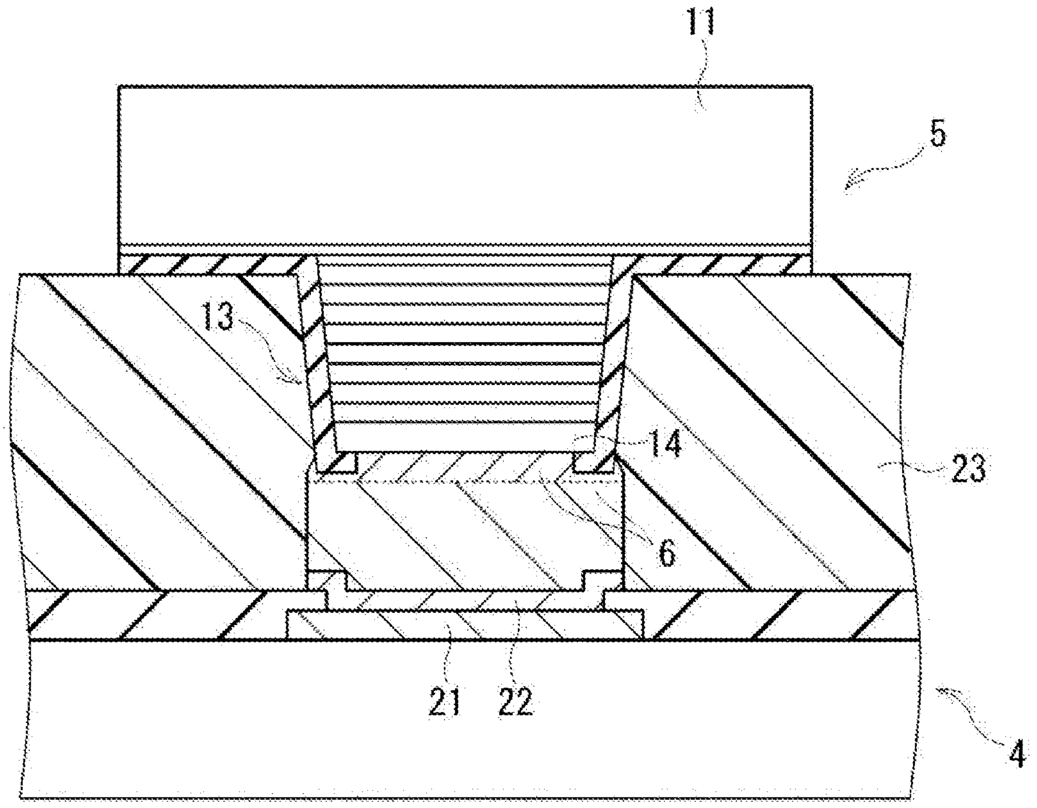
FIG. 3A is a cross-sectional view showing in detail a bonding portion between the LDD substrate and the LD chip.
Figure 3B:
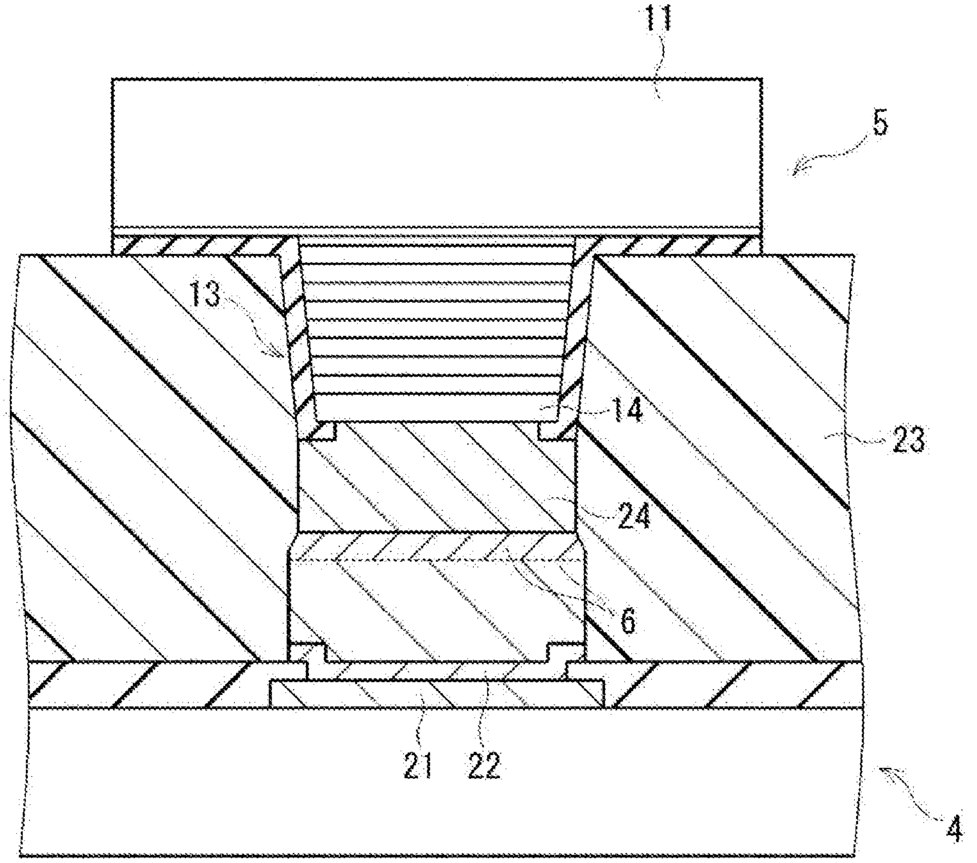
FIG. 3B is a cross-sectional view showing a modified example of FIG. 3A.

FIGS. 3A and 3B are cross-sectional views showing in detail a bonding portion between the LDD substrate 4 and the LD chip 5. In the LD chip 5, the plurality of light-emitting elements 13 are formed on the substrate, the anode electrodes 14 are formed on the upper surface of each light-emitting element 13, and then the light-emitting elements 13 are individualized in units of one or more. FIGS. 3A and 3B show examples of bonding the LD chip 5 including individualized light-emitting elements 13 to the LDD substrate 4.

The LDD substrate 4 shown in FIG. 3A has the first pad 21 to which a drive signal is output, a first conductive layer 22 disposed on the first pad 21, and the bonding layer 6 disposed on the first conductive layer 22. The bonding layer 6 is a laminated film including a solder material and the like. The LD chip 5 in FIG. 3 has a light-emitting element 13 having a mesa shape and the second pad 14 disposed on the light-emitting element 13. The second pad 14 is disposed to face the first pad 21 and is bonded to the bonding layer 6. That is, the first pad 21 and the second pad 14 are bonded together via the bonding layer 6.

An underfill layer 23 is injected into a gap between the LDD substrate 4 and the LD chip 5. Thus, a bonding portion between the first pad 21 and the second pad 14 can be protected, and peeling or the like can be prevented. As will be described later, it is required to select a material of the underfill layer 23 or the like that does not cause a problem called bleeding, in which the underfill layer 23 crawls up to a side surface of the LD chip 5.

FIG. 3B is a modified example of FIG. 3A, in which a second conductive layer 24 is disposed on the second pad 14 of the LD chip 5. This second conductive layer 24 is bonded to the bonding layer 6 of the LDD substrate 4. That is, the second conductive layer 24 of the LD chip 5 is bonded to the first conductive layer 22 via the bonding layer 6 on the LDD substrate 4. The second conductive layer 24 functions as a under barrier metal (UBM) layer that prevents a metal material forming the second pad 14 from diffusing into the bonding layer 6.

In this way, in the light-emitting device 1 according to the present embodiment, the bonding layer 6 is formed on the first pad 21 of the LDD substrate 4 instead of on the LD chip 5 side, and then bonded to the LD chip 5. In the state in which the first pad 21 is formed, the LDD substrate 4 is almost flat although there are some steps, and thus positioning of the bonding layer 6 can be easily performed. Accordingly, the bonding layer 6 can be formed relatively easily at a target location on the first pad 21 of the LDD substrate 4. Therefore, according to the present embodiment, the bonding layer 6 can be formed on the first conductive layer 22 without positional deviation, and when the LD chip 5 is bonded, problems such as short-circuiting between the anode electrodes 14 of the adjacent light-emitting elements 13 do not occur.

Figure 4A:
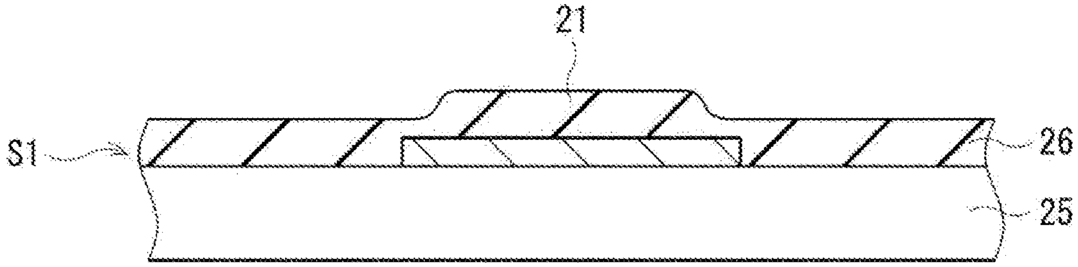
FIG. 4A is a cross-sectional process view showing a manufacturing process of the LDD substrate according to the present embodiment.

FIGS. 4A to 4H are process cross-sectional views showing a manufacturing process of the LDD substrate 4 according to the present embodiment. First, as shown in FIG. 4A, the first pad 21 is formed on the first surface S1 of the first substrate 25, and an insulating film 26 is formed on the first surface S1 to cover the first pad 21. The first substrate 25 is, for example, a silicon substrate. The insulating film 26 is provided to protect the first pad 21 and prevent short-circuiting between adjacent first pads 21. The insulating film 26 may be an organic insulating film or an inorganic insulating film. A material of the organic insulating film is, for example, a polyimide or polymer. A material of the inorganic insulating film is, for example, SiO2 or SiN.

A material of the first pad 21 is, for example, aluminum (Al). The first pad 21 is made of aluminum to facilitate wire bonding. Also, the bonding between the LDD substrate 4 and the LD chip 5 can be performed without wire bonding. Wire bonding may be performed when the mounting substrate 2 shown in FIG. 1 is connected to the first pad 21. Aluminum has high conductivity and also has excellent contact characteristics with bonding wires.

Further, when the first pad 21 is made of aluminum, an oxide film passivation is formed on its surface, and resistance to corrosion and the like can be enhanced. Also, the first pad 21 may be made of a metal other than aluminum.

The first pad 21 is for applying drive signals to the anode electrode 14 of the light-emitting element 13 inside the LD chip 5. Although not shown in FIG. 4A, a number of first pads 21 corresponding to the number of light-emitting elements 13 in the LD chip 5 are formed on the LDD substrate 4.

Figure 4B:
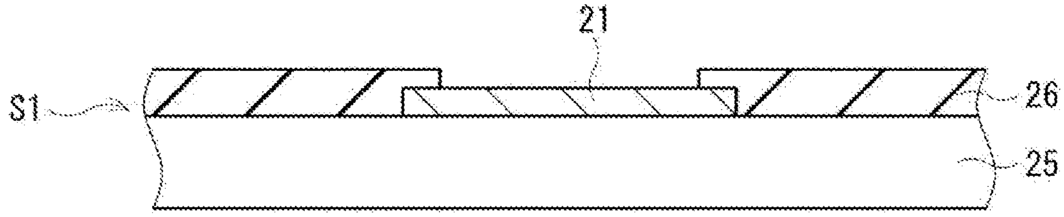
FIG. 4B is a cross-sectional process view following FIG. 4A.

Next, as shown in FIG. 4B, the insulating film 26 is patterned so that the first pad 21 is exposed. The patterning of the insulating film 26 may be performed by dry etching or wet etching.

Figure 4C:
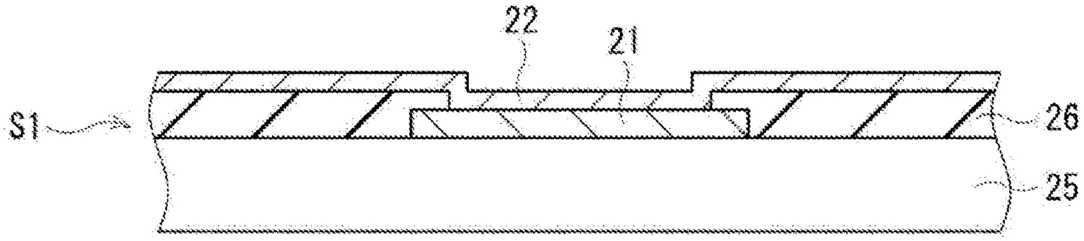
FIG. 4C is a cross-sectional process view following FIG. 4B.

Next, as shown in FIG. 4C, the first conductive layer 22 is formed on the first surface S1 of the LDD substrate 4. The first conductive layer 22 functions as a barrier layer for the bonding layer 6. The first conductive layer 22 is formed by laminating a plurality of metal layers. In a case in which the first pad 21 is made of aluminum, a bottom layer of the first conductive layer 22 is preferably a titanium (Ti) layer. Thus, migration of aluminum can be inhibited. A copper (Cu) layer, for example, is formed on the Ti layer. The first conductive layer 22 configured of the laminated film 12 of the Ti layer and the Cu layer functions as a barrier layer (an under barrier metal (UBM) layer) for the bonding layer 6.

The first conductive layer 22 has steps at boundary portions between the first pad 21 and the insulating film 26, which are disposed on the upper surface of the first pad 21 and side and upper surfaces of the insulating film 26, and the first conductive layer 22 is formed to have a predetermined film thickness so that the first conductive layer 22 is not disconnected at stepped portions. More specifically, the thickness of the first conductive layer 22 depends on a thickness of the insulating film 26. As the thickness of the insulating film 26 increases, the thickness of the first conductive layer 22 also needs to increase. The Ti layer and the Cu layer forming the first conductive layer 22 are formed by sputtering, vapor deposition, or the like.

Figure 4D:
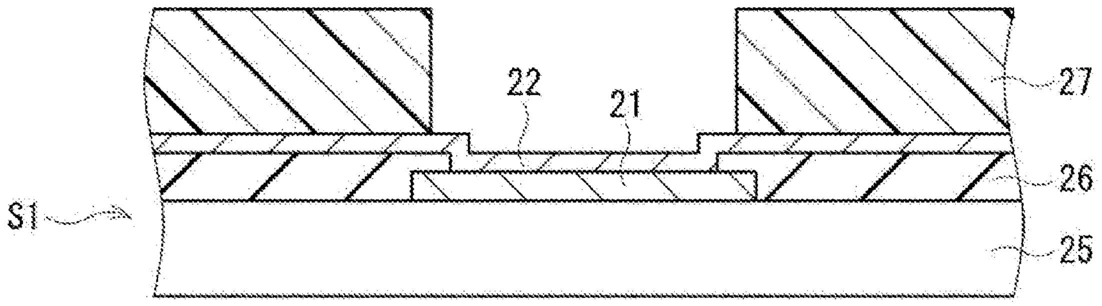
FIG. 4D is a cross-sectional process view following FIG. 4C.

Next, as shown in FIG. 4D, a photoresist 27 is formed on the first surface S1 of the LDD substrate 4, and the photoresist 27 is patterned by a lithography process. Specifically, the photoresist 27 is patterned such that an upper surface of the first conductive layer 22 is exposed. End faces of an opening portion formed by patterning the photoresist 27 may be positioned outward or inward from the steps of the first conductive layer 22. A thickness of the photoresist 27 is set in accordance with a thickness of the bonding layer 6. For example, in a case in which the first pads 21 are formed at a narrow pitch of 20 μm or less, the film thickness of the photoresist 27 is about 3 to 15 μm.

Figure 4E:
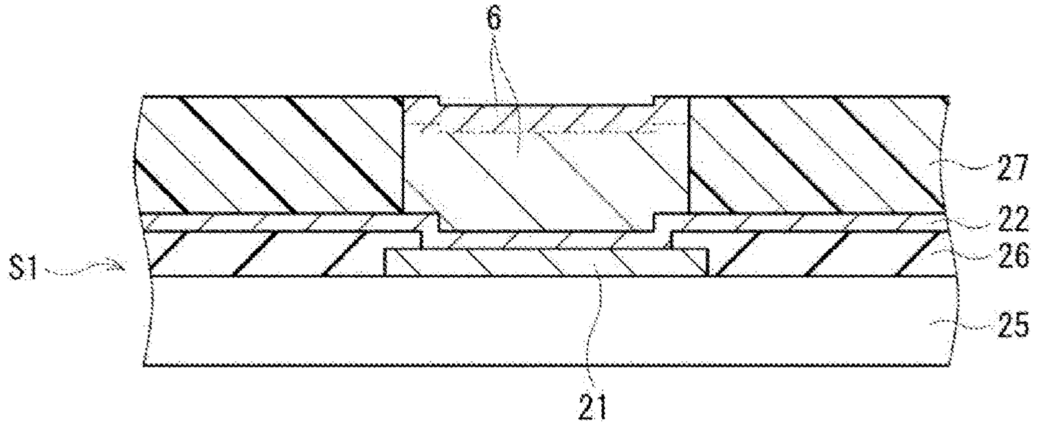
FIG. 4E is a cross-sectional process view following FIG. 4D.

Next, as shown in FIG. 4E, the bonding layer 6 is formed on the first conductive layer 22 in the opening portion of the photoresist 27. In the present specification, the bonding layer 6 may be called a plated layer or a solder layer. The bonding layer 6 may be formed using an electrolytic plating method or an electroless plating method. The bonding layer 6 is formed by laminating a plurality of metal layers. A material of the bonding layer 6 has, for example, a three-layer structure of Cu pillar/Ni/SnAg. Alternatively, a four-layer structure of Cu/Ni/Cu/SnAg may be used. Alternatively, a two-layer structure of Ni/SnAg may be used. In addition, a laminated film 12 such as Cu/Ni/AuSn, Cu/Ni/Cu/AuSn, Ni/AuSn, Cu/Ni/SnBi, Cu/Ni/Cu/SnBi, or Ni/SnBi may be used.

The reason why the Ni layer is sandwiched between the SnAg layer and the Cu layer is that if there is no Ni layer, SnAg and Cu easily react to form an intermetallic compound (IMC). Once the IMC is formed, it becomes a factor that lowers reliability. The Ni layer functions as a barrier layer against the SnAg layer and the Cu layer.

Although thicknesses of each layer constituting the bonding layer 6 are arbitrary, it is desirable to set the thickness of the Ni layer such that the SnAg layer does not diffuse into the underlying Cu layer. As for the SnAg layer, it is desirable to set a film thickness of the SnAg layer such that a sufficient amount of the SnAG layer adheres also to the LD chip 5 side when the LD chip 5 is bonded. As an example, in a case in which the bonding layer 6 is Cu/Ni/SnAu, a thickness of the Cu layer is 1 to 10 μm, a thickness of the Ni layer is 1 to 8 μm, and a thickness of the SnAu layer is 1 to 10 m.

Figure 4F:
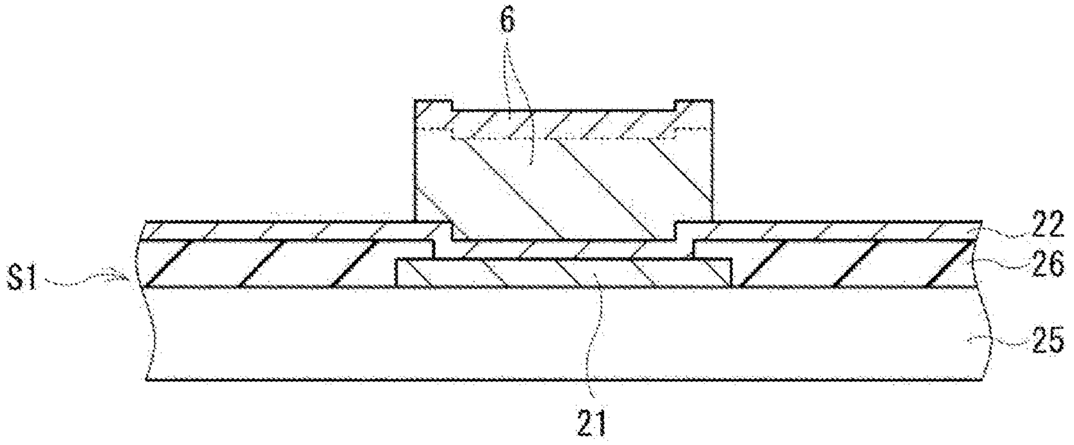
FIG. 4F is a cross-sectional process view following FIG. 4E.

Next, as shown in FIG. 4F, the patterned photoresist 27 is removed by etching or the like.

Figure 4G:
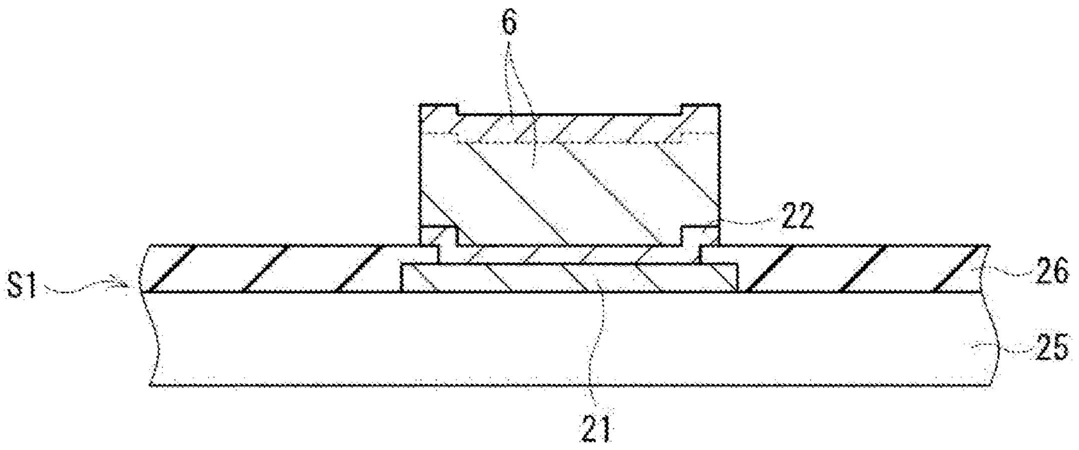
FIG. 4G is a cross-sectional process view following FIG. 4F.

Next, as shown in FIG. 4G, a portion of the first conductive layer 22 is removed. Here, the portion of the first conductive layer 22 is removed by wet etching, for example. For example, in a case in which the pitch of the first pads 21 is 20 μm, a diameter of the bonding layer 6 is approximately 10 μm, and thus it is important to control an amount of undercut of the first conductive layer 22. It is desirable to adjust the amount of undercut of the first conductive layer 22 by controlling a type of wet etching etchant and etching conditions.

Figure 4H:
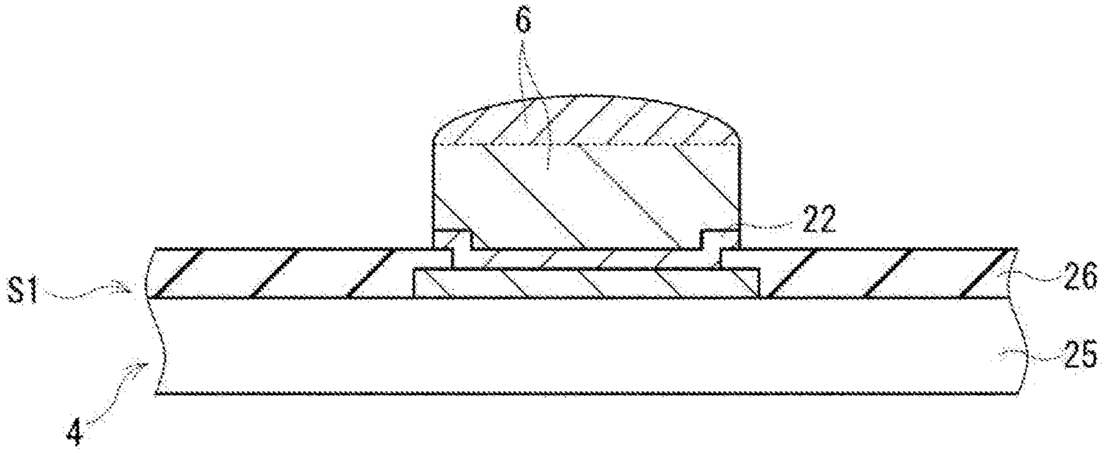
FIG. 4H is a cross-sectional process view following FIG. 4G.

Next, as shown in FIG. 4H, the bonding layer 6 is reflowed. The reflow process may be performed while flux is formed on the surface of the bonding layer 6, or the reflow process of the bonding layer 6 may be performed in formic acid. In this case, wicking may occur in which the solder material such as SnAg wraps around sidewalls of the Ni layer or the Cu layer. In order to prevent wicking, it is important to control a temperature profile of the reflow process. If the temperature is too high, wicking will easily occur, and if the temperature is too low, segregation will occur in the solder material such as SnAg, resulting in poor bonding. It is desirable to perform both temperature control and time control of the reflow process.

Through the above process, the bonding layer 6 subjected to the reflow process is formed on the first pad 21 of the LDD substrate 4. As described in each manufacturing process of FIGS. 4A to 4H, since the first pad 21 on the LDD substrate 4 is formed on a substantially flat surface, the first conductive layer 22 and the bonding layer 6 can be formed relatively easily by ordinary photolithography or the like.

Figure 5A:
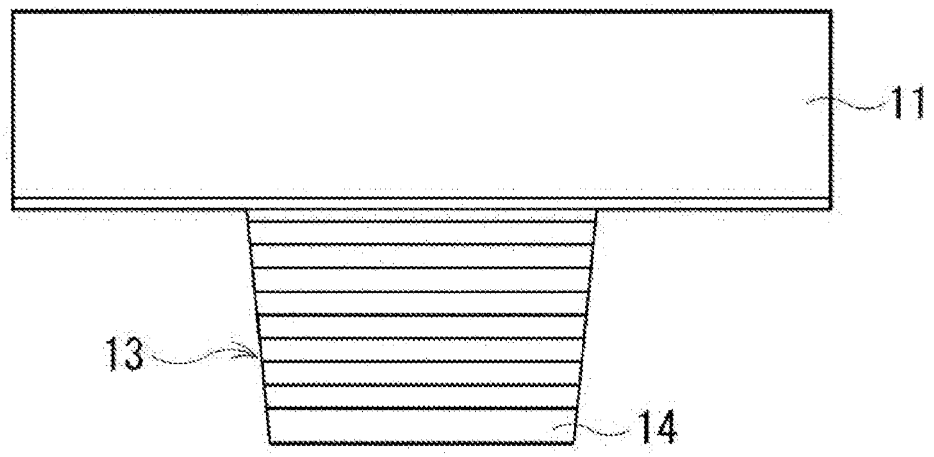
FIG. 5A is a cross-sectional process view showing a manufacturing process of the LD chip according to the present embodiment.
Figure 5B:
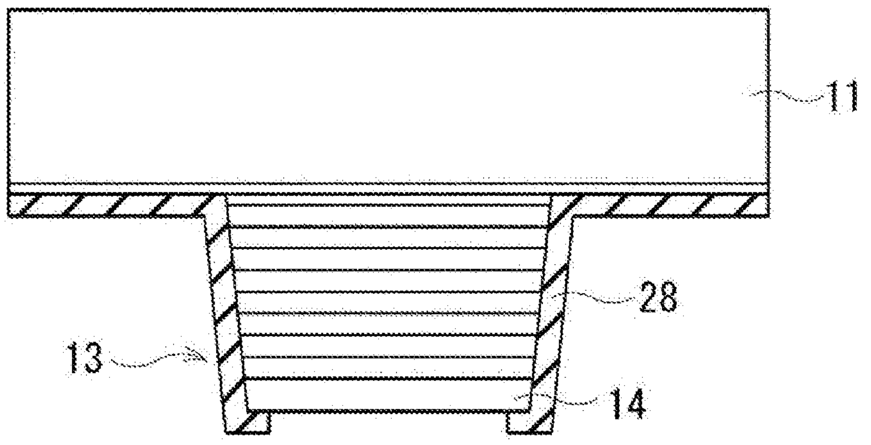
FIG. 5B is a cross-sectional process view following FIG. 5A.
Figure 5C:
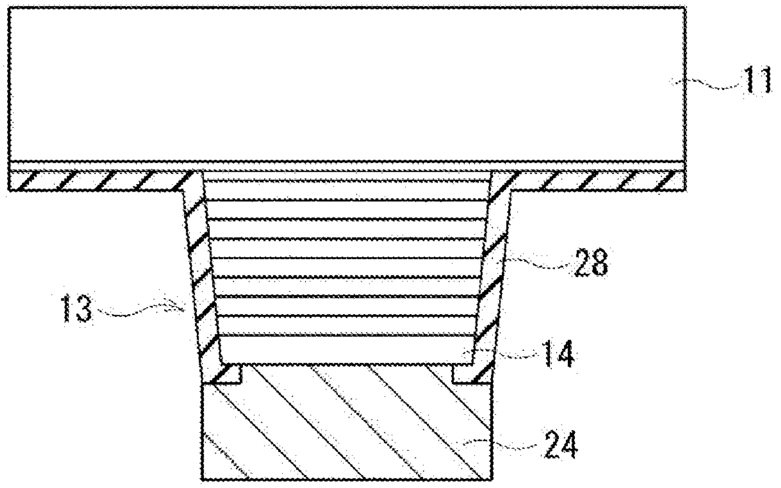
FIG. 5C is a cross-sectional process view following FIG. 5B.

Next, a manufacturing process on the LD chip 5 side will be described. FIGS. 5A to 5C are cross-sectional process views showing a manufacturing process of the LD chip 5 according to the present embodiment. As shown in FIG. 5A, the plurality of mesa-shaped light-emitting elements 13 are formed on the substrate of the LD chip 5. Each light-emitting element 13 is formed of the laminated film 12 as described above. In the process of FIG. 5A, the second pad 14 functioning as the anode electrode 14 is formed on the upper surface of each light-emitting element 13 (bottom surface of the light-emitting element 13 in FIG. 5A) when viewed from the substrate side. The second pad 14 is, for example, a laminated film of Ti/Pt/Au. The Ti layer is a barrier layer when connected to the laminated film 12 forming the light-emitting element 13. The Pt layer is a barrier layer for the Au layer. The Au layer functions as an antioxidant layer that prevents the surface of the second pad 14 from being oxidized. The Ti layer has a thickness of, for example, 50 to 200 nm. The Pt layer has a thickness of, for example, 100 to 500 nm. The Au layer has a thickness of, for example, 50 to 300 nm. The Au layer is effective in inhibiting oxidation of the surface of the first pad 21, but if the Au layer is too thick, Au will diffuse into the bonding layer 6 and cause voids, and thus it is required to control the thickness of the Au layer.

Next, as shown in FIG. 5B, an insulating film 28 is formed on a surface of the LD chip 5 on the second surface S2 side. The insulating film 28 is, for example, SiN. A film thickness of the insulating film 28 is, for example, about 230 nm. By increasing the film thickness of the insulating film 28 to some extent, it is possible to prevent moisture from entering the LD chip 5 from the outside. After that, an opening portion is formed at a portion of the insulating film 28. Formation of the opening portion can be performed by dry etching or wet etching.

Next, as shown in FIG. 5C, the second conductive layer 24 is formed in the opening portion of the insulating film 28. The second conductive layer 24 functions as a barrier layer (UBM layer) that prevents diffusion of Au and Pt contained in the second pad 14. The second conductive layer 24 is, for example, a laminated film of Ni/Au. The Ni layer can prevent Au and Pt from diffusing into the second pad 14. In addition, the second conductive layer 24 may not an essential layer and can also be omitted.

In a case in which the second conductive layer 24 is configured of the laminated film 12 of Ni/Au, a thickness of the Ni layer is, for example, about 500 to 3000 nm, and a thickness of the Au layer is, for example, about 25 to 300 nm.

A proportion between a size of the second pad 14 and a size of the second conductive layer 24 is important. For example, in a case in which the second conductive layer 24 has a diameter of 10 m, the bonding layer 6 preferably has a diameter of 8 to 10 m. That is, it is desirable that a diameter size of the bonding layer 6 be 80 to 100% of a diameter size of the second conductive layer 24. As the diameter size of the bonding layer 6 decreases, the bonding layer 6 may spread toward the second pad 14 and cause shortage of the bonding layer 6, and thus voids may be formed in the bonding layer 6.

The above-described manufacturing processes of FIGS. 5A to 5C are performed while the size of the substrate of the LD chip 5 remains unchanged. After the process of FIG. 5C is completed, a process of individualizing the LD chip 5 in units of one or a plurality of light-emitting elements 13 is performed. After that, a process of bonding each of the individualized light-emitting element 13 to the LDD substrate 4 is performed.

Figure 6A:
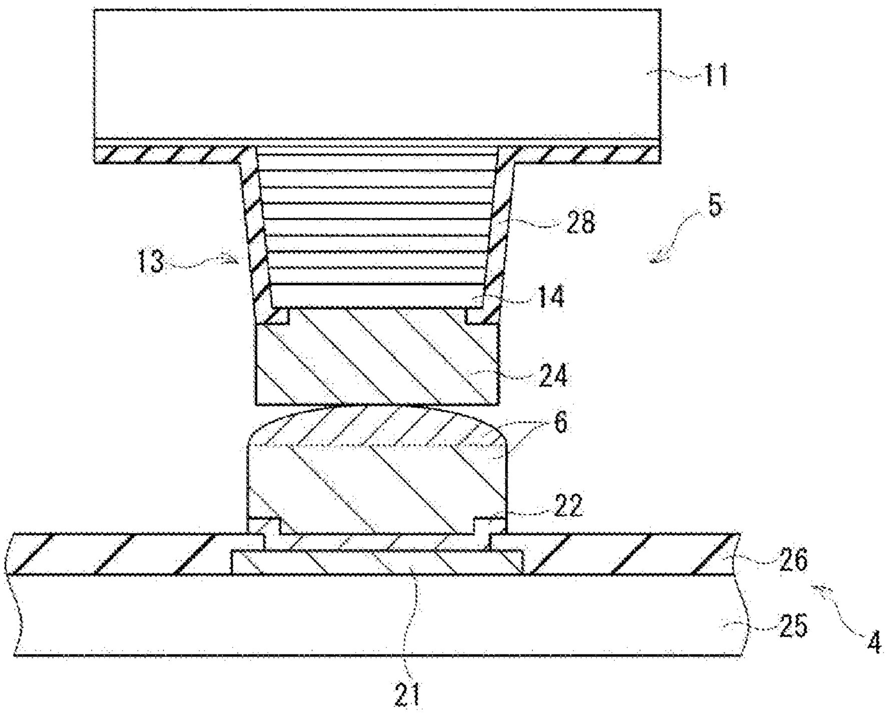
FIG. 6A is a manufacturing process diagram showing in detail a process of bonding individualized light-emitting elements to the LDD substrate.
Figure 6B:
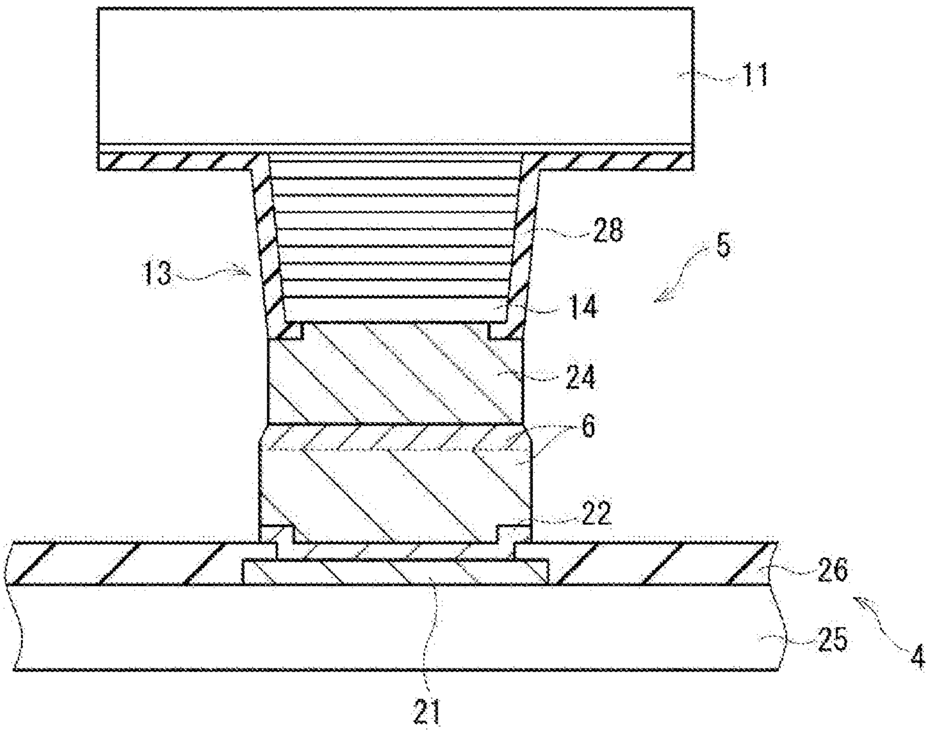
FIG. 6B is a cross-sectional process view following FIG. 6A.
Figure 6C:
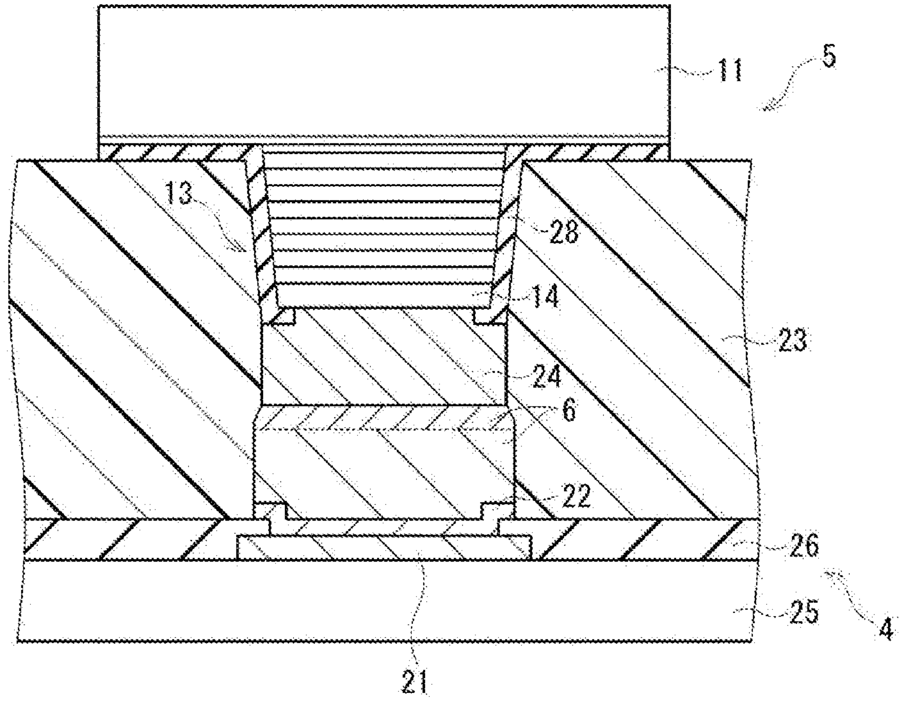
FIG. 6C is a cross-sectional process view following FIG. 6B.

FIGS. 6A to 6C are manufacturing process diagrams showing in more detail the process of bonding each of the individualized light-emitting element 13 to the LDD substrate 4. The LDD substrate 4 has a size of a wafer. The LD chip 5 side is individualized in units of one or a plurality of light-emitting elements 13. For this reason, FIGS. 6A to 6C are for connecting the LD chip 5 to the LDD substrate 4 by chip on wafer (CoW).

First, as shown in FIG. 6A, the individualized light-emitting element 13 is positioned on the LDD substrate 4 and reflowed. CoW bonding is generally performed with a flip chip bonder, but a desired shape can also be obtained with a thermo-compressive bonder (TCB). In the case of a flip chip bonder, the individualized LD chip 5 is temporarily placed on the surface of the LDD substrate 4 with flux formed thereon, and a reflow process shown in FIG. 6B is performed.

There are two types of reflow process, either of which can be adopted. One is to form flux on the surface of the LDD substrate 4 in advance and then perform the reflow process, as described above. Another is to perform the reflow process in formic acid while the flux is not formed. In the case of the present embodiment, since the diameter size of the bonding layer 6 on the LDD substrate 4 is small, there is a possibility that the solder material in the bonding layer 6 will wrap around a side wall of the Ni layer or the Cu layer and cause wicking. A temperature profile of the reflow is important to prevent wicking. If the temperature is too high, wicking tends to occur, and if the temperature is too low, segregation will occur in the solder material, resulting in poor bonding. In the reflow process of FIG. 6B, it is desirable to control a temperature in a peak region, for example, at 220° C. to 240° C. for about 40 to 70 seconds.

Next, as shown in FIG. 6C, the underfill layer 23 is injected into the gap between the LDD substrate 4 and the LD chip 5. Formation of the underfill layer 23 is an important process for ensuring reliability of the connection between the LDD substrate 4 and the LD chip 5. A height of the LD chip 5 side is as thin as about 100 μm, and there is a risk of bleeding in which the underfill layer 23 crawls up to the substrate side of the LD chip 5. For this reason, it is important to select a material of the underfill layer 23 and control a process of injecting the underfill layer 23. As the material of the underfill layer 23, it is desirable to select a material having a high glass transition temperature Tg and a curing temperature Tp lower than the glass transition temperature Tg to achieve improvement in reliability.

When the LD chip 5 is individualized, the substrate is diced. In this case, in blade dicing, unevenness of a side surface of the individualized substrate 11 increases. If the side surface of the substrate 11 has large unevenness, bleeding may occur in which the underfill layer 23 injected into the gap between the LDD substrate 4 and the LD chip 5 crawls up the side surface of the substrate 11. On the other hand, in stealth dicing, since the substrate 11 is diced by radiating laser light, diced surfaces of the substrate 11 are flat, and the above-described bleeding hardly occurs. Accordingly, when the LD chip 5 is individualized, it is desirable to perform stealth dicing.

In this way, in the present embodiment, instead of forming the bonding layer 6 on the upper surface of each light-emitting element 13 of the LD chip 5, the bonding layer 6 is formed on the first pad 21 of the LDD substrate 4 and then the LD chip 5 is bonded thereto, and thus misalignment of a formation position of the bonding layer 6 is less likely to occur. Since each light-emitting element 13 of the LD chip 5 is machined into a mesa shape, it is highly difficult to form the bonding layer 6 on the upper surface of each light-emitting element 13 with high accuracy, and thus due to the misalignment of the formation position of the bonding layer 6, problems such as short-circuiting between the anode electrodes 14 of two adjacent light-emitting elements 13 tend to occur. On the other hand, since surfaces around the first pad 21 of the LDD substrate 4 are substantially flat surfaces, Formation of the bonding layer 6 on the first pad 21 can also be performed relatively easily. Accordingly, according to the present embodiment, the bonding layer 6 can be formed more easily and accurately than in the case of forming the bonding layer 6 on the upper surface of each light-emitting element of the LD chip 5, and the bonding between the LDD substrate 4 and the LD chip 5 can also be performed without misalignment.

Figure 7:
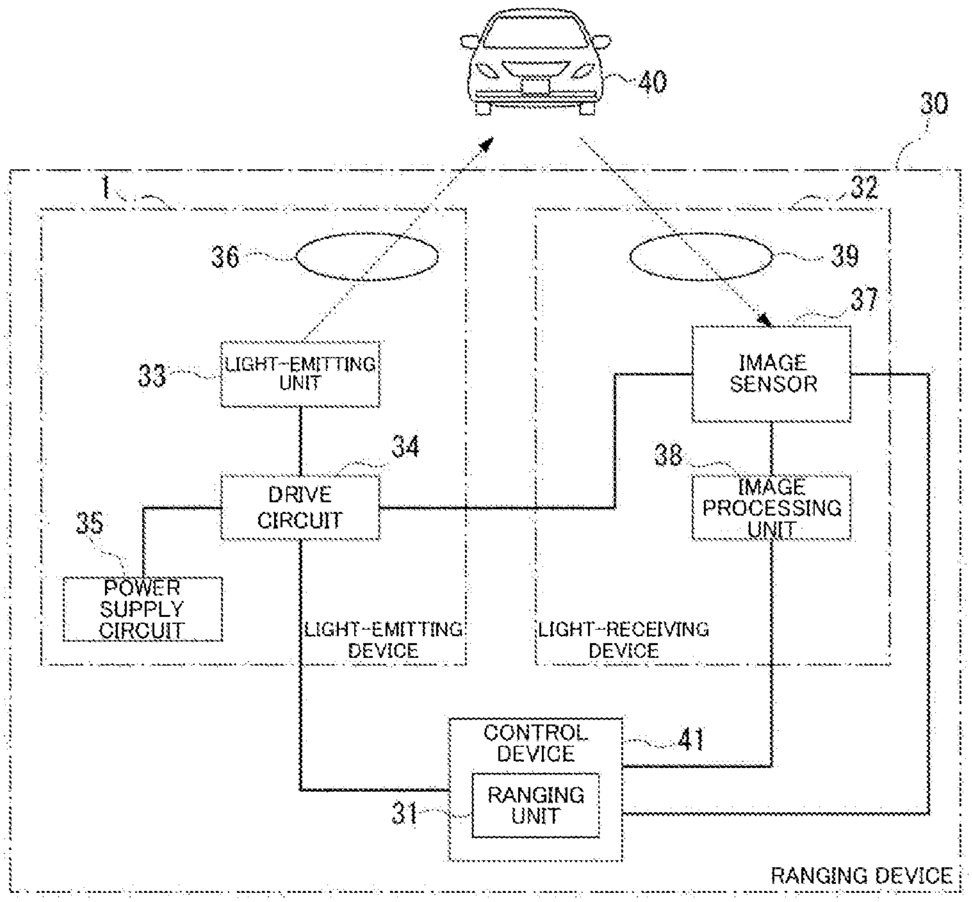
FIG. 7 is a block diagram showing a schematic configuration of a ranging device including the light-emitting device according to the present embodiment.

The light-emitting device 1 according to the present embodiment can be used, for example, in a ranging device that measures a distance to an object in a not-contact manner. FIG. 7 is a block diagram showing a schematic configuration of a ranging device 30 having the light-emitting device 1 according to the present embodiment. The ranging device 30 of FIG. 7 includes the light-emitting device 1 and a light-receiving device 32. The ranging device 30 of FIG. 1 irradiates a subject 40 with light emitted from the light-emitting device 1, receives light reflected by the subject 40 with the light-receiving device 32 to capture an image of the subject 40, and measures (calculates) a distance to subject 40 with a control device 41 using an image signal output from the light-receiving device 32. The light-emitting device 1 functions as a light source for the light-receiving device 32 to image the subject 40.

The light-emitting device 1 includes a light-emitting unit 33, a drive circuit 34, a power supply circuit 35, and a light-emitting side optical system 36. The light-receiving device 32 includes an image sensor 37, an image processing unit 38, and an imaging side optical system 39. The control device 41 includes a ranging unit 31.

The light-emitting unit 33 includes, for example, the configuration shown in FIG. 1 and emits laser light for irradiating the subject 40. The drive circuit 34 is an electric circuit for driving the light-emitting unit 33. The power supply circuit 35 is an electric circuit for generating a power supply voltage for the drive circuit 34.

In the ranging device 30 of the present embodiment, for example, the power supply circuit 35 generates the power supply voltage from an input voltage supplied from a battery in the ranging device 30, and the drive circuit 34 drives the light-emitting unit 33 using the power supply voltage. The drive circuit 34 may be incorporated in the above-described LDD substrate 4, or may be provided separately from the LDD substrate 4 and input a drive signal to the LDD substrate 4.

The light-emitting side optical system 36 includes various optical elements and irradiates the subject 40 with light from the light-emitting unit 33 via these optical elements. Similarly, the imaging side optical system 39 includes various optical elements and receives light from the subject 40 via these optical elements.

The image sensor 37 receives light from the subject 40 via the imaging side optical system 39 and converts this light into an electrical signal by photoelectric conversion. The image sensor 37 is, for example, a charge coupled device (CCD) sensor or a complementary metal oxide semiconductor (CMOS) sensor. Also, the image sensor 37 may be single photon avalanche diode (SPAD) array in which SPADs are disposed two-dimensionally. A SPAD operates in a Geiger mode in which avalanche multiplication is performed for a single incident photon to flow a large current. For this reason, a small amount of incident light can also be detected. The image sensor 37 of the present embodiment converts the electrical signal from an analog signal to a digital signal by analog to digital (A/D) conversion and outputs an image signal as the digital signal to the image processing unit 38. Further, the image sensor 37 of the present embodiment outputs a frame synchronization signal to the drive circuit 34, and the drive circuit 34 causes the light-emitting unit 33 to emit light at timing in accordance with a frame period of the image sensor 37 on the basis of the frame synchronization signal.

The image processing unit 38 performs various image processing on the image signal output from the image sensor 37. The image processing unit 38 includes an image processing processor such as a digital signal processor (DSP).

The control device 41 controls various operations of the ranging device 30 of FIG. 1 and controls, for example, a light-emitting operation of the light-emitting device 1 and an imaging operation of the light-receiving device 32. The control device 41 includes, for example, a central processing unit (CPU), a read only memory (ROM), a random access memory (RAM), and the like.

The ranging unit 31 measures the distance to the subject on the basis of the image signal that is output from the image sensor 37 and subjected to image processing by the image processing unit 38. The ranging unit 31 adopts, for example, a structured light (STL) method or a time of flight (ToF) method as a ranging method. Further, the ranging unit 31 may measure a distance between the ranging device 30 and the subject for each part of the subject on the basis of the above image signal and specify a three-dimensional shape of the subject.

(Configuration Example of Electronic Device)

Figure 8:
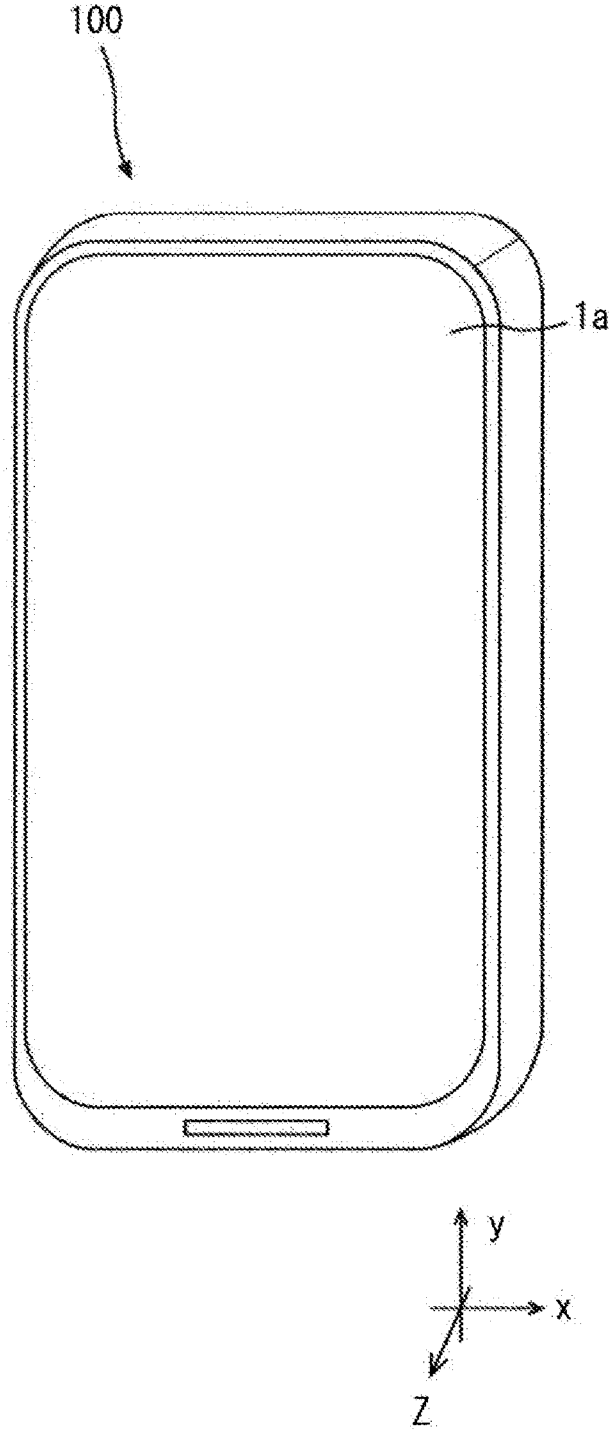
FIG. 8 illustrates an example of an electronic device according to the present disclosure.
Figure 9:
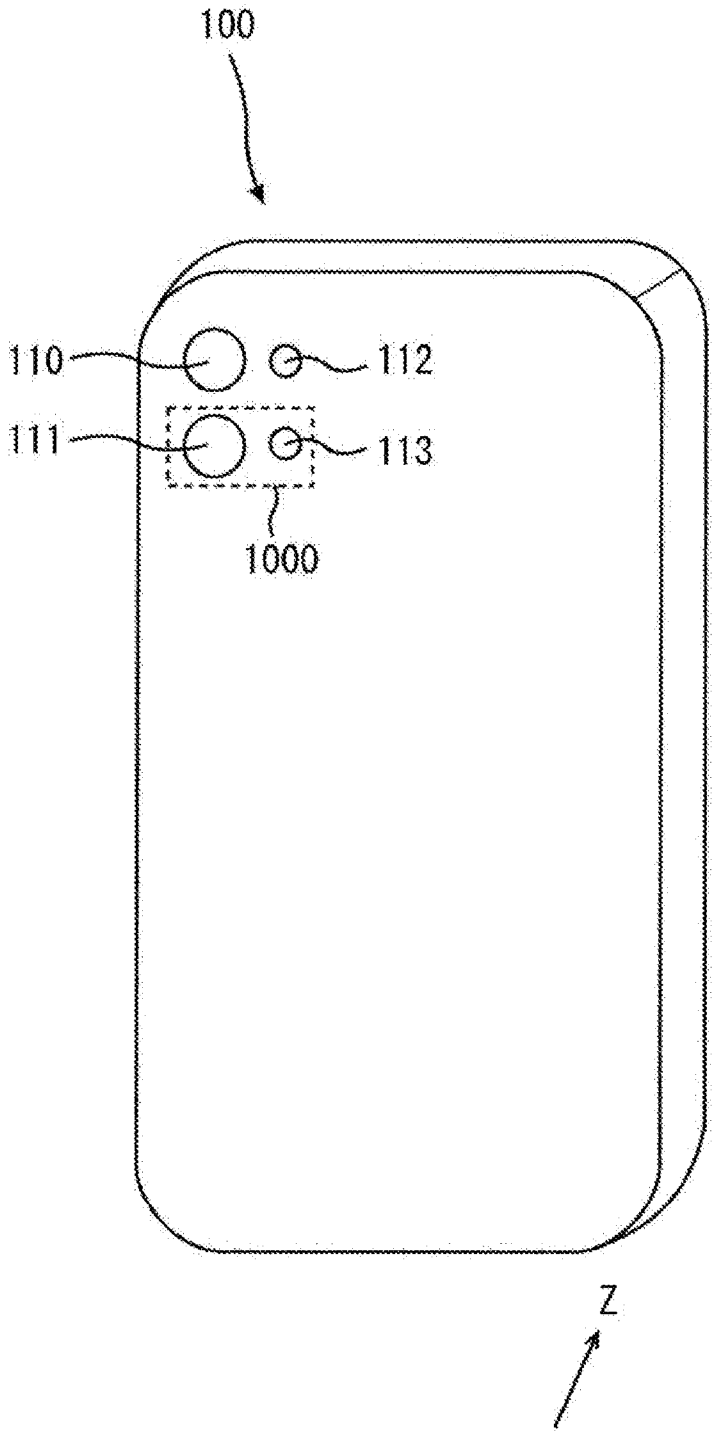
FIG. 9 illustrates an example of an electronic device according to the present disclosure.

FIGS. 8 and 9 show an example of an electronic device in which the ranging device 30 according to the present disclosure is mounted. FIG. 8 shows a configuration of an electronic device 100 when viewed from a positive direction side of a z axis. On the other hand, FIG. 9 shows a configuration of the electronic device 100 when viewed from a negative direction side of the z axis. The electronic device 100 has, for example, a substantially flat plate shape and has a display unit 1*a* on at least one surface (here, a surface on the positive direction side of the z axis). The display unit 1*a* can display an image using a liquid crystal method, a micro LED method, or an organic electroluminescence method, for example. However, a display method in the display unit 1*a* is not limited. Also, the display unit 1*a* may include a touch panel and a fingerprint sensor.

A first imaging unit 110, a second imaging unit 111, a first light-emitting unit 112, and a second light-emitting unit 113 are mounted on the surface of the electronic device 100 on the negative direction side of the z axis. The first imaging unit 110 is, for example, a camera module that can capture a color image. The camera module includes, for example, a lens system and an imaging element that performs photoelectric conversion of light condensed by the lens system. The first light-emitting unit 112 is, for example, a light source used as a flash for the first imaging unit 110. For example, a white LED can be used for the first light-emitting unit 112. However, a type of light source used as the first light-emitting unit 112 is not limited.

The second imaging unit 111 is, for example, an imaging element that can perform ranging using a ToF method. The second imaging unit 111 corresponds to the light-receiving device 32 in FIG. 7, for example. The second light-emitting unit 113 is a light source that can be used for ranging using a ToF method. The second light-emitting unit 113 corresponds to the light-emitting unit 33 in FIG. 7, for example. In this way, the electronic device 100 shown in FIGS. 8 and 9 has the ranging device 30 shown in FIG. 7. The electronic device 100 can execute various types of processing on the basis of distance images output from the ranging device 30.

A case in which the electronic device according to the present disclosure is a smartphone or tablet has been described here. However, the electronic device according to the present disclosure may be other types of devices such as, for example, a game console, a vehicle-mounted device, a PC, and a surveillance camera.

The ranging device 30 according to the present disclosure may include a signal generator, a plurality of cascaded flip-flops, a circuit block, a pixel array, and a signal processing unit. The signal generator is configured to generate clock signals. The circuit block is configured to supply a first signal to respective clock terminals of the plurality of flip-flops in response to the clock signals, and a second signal to an input terminal of a first stage flip-flop of the plurality of flip-flops. The pixel array includes pixels configured to be driven by pulse signals supplied from different stages of the plurality of flip-flops. The signal processing unit is configured to generate distance images on the basis of charges generated by photoelectric conversion in the pixels of the pixel array.

The electronic device according to the present disclosure may include a signal generator, a plurality of cascaded flip-flops, a circuit block, and a pixel array. The signal generator is configured to generate clock signals. The circuit block is configured to supply a first signal to respective clock terminals of the plurality of flip-flops in response to the clock signals, and a second signal to an input terminal of a first stage flip-flop of the plurality of flip-flops. The pixel array includes pixels configured to be driven by pulse signals supplied from different stages of the plurality of flip-flops.

(Example of Application to Mobile Object)

The technique according to the present disclosure (the present technique) can be applied to various products. For example, the technique according to the present disclosure may be realized as a device mounted in any types of mobile objects such as automobiles, electric vehicles, hybrid electric vehicles, motorcycles, bicycles, personal mobility devices, airplanes, drones, ships, and robots.

Figure 10:
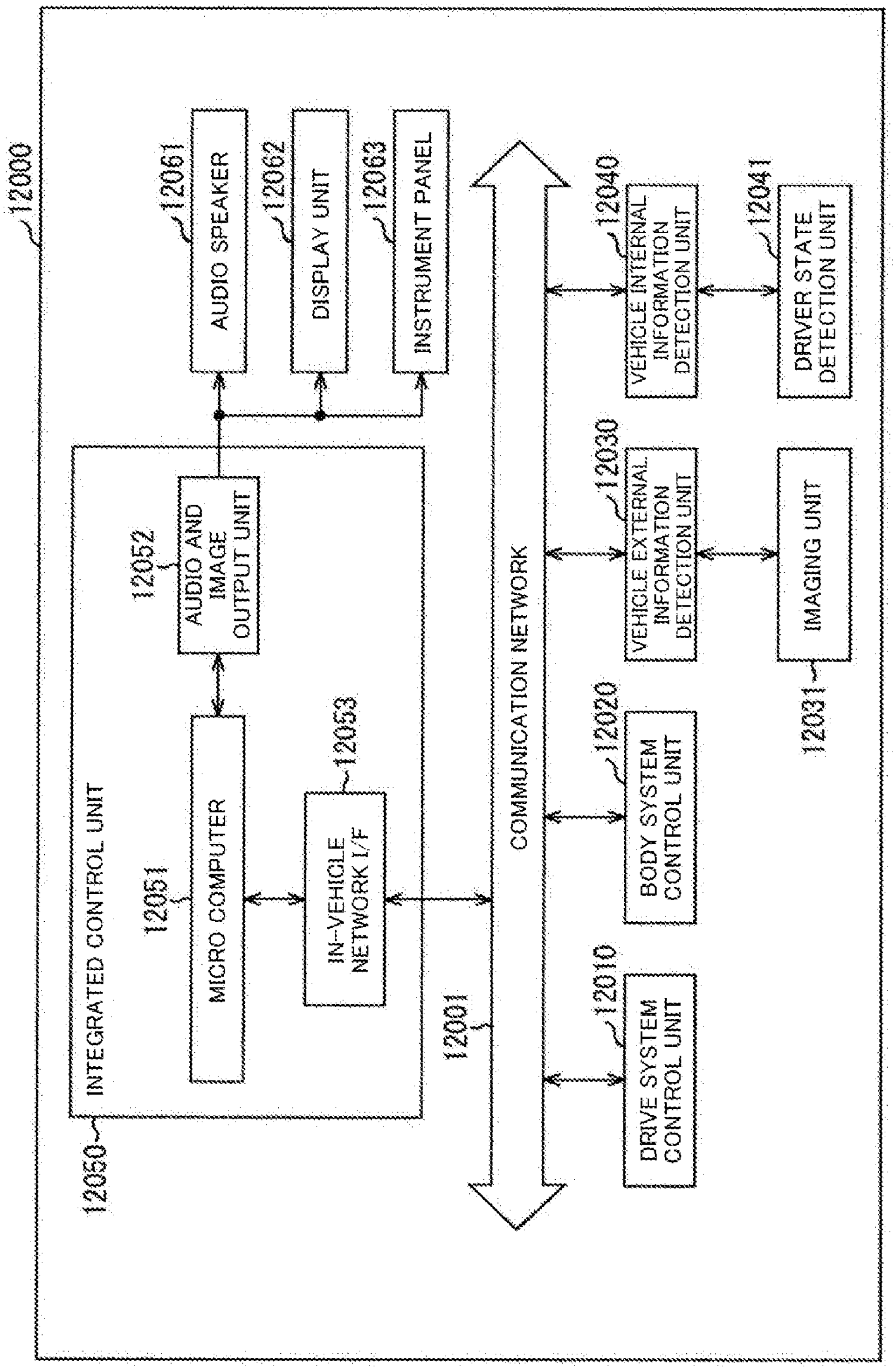
FIG. 10 is a block diagram showing an example of a schematic configuration of a vehicle control system.

FIG. 10 is a block diagram showing a schematic configuration example of a vehicle control system, which is an example of a mobile object control system to which the technique according to the present disclosure can be applied.

A vehicle control system 12000 includes a plurality of electronic control units connected thereto via a communication network 12001. In the example shown in FIG. 10, the vehicle control system 12000 includes a drive system control unit 12010, a body system control unit 12020, a vehicle external information detection unit 12030, a vehicle internal information detection unit 12040, and an integrated control unit 12050. In addition, as a functional configuration of the integrated control unit 12050, a microcomputer 12051, an audio and image output unit 12052, and an in-vehicle network interface (I/F) 12053 are illustrated.

The drive system control unit 12010 controls operations of devices related to a drive system of a vehicle in accordance with various programs. For example, the drive system control unit 12010 functions as a control device for a driving force generation device for generating a vehicle driving force, such as an internal combustion engine or a driving motor, a driving force transmission mechanism for transmitting a driving force to wheels, a steering mechanism for adjusting a steering angle of a vehicle, and a braking device for generating a braking force of a vehicle, and the like.

The body system control unit 12020 controls operations of various devices mounted in a vehicle body in accordance with various programs. For example, the body system control unit 12020 functions as a control device of a keyless entry system, a smart key system, a power window device, or various lamps such as a headlamp, a back lamp, a brake lamp, a turn signal, and a fog lamp. In this case, radio waves transmitted from a portable device that substitutes for a key or signals of various switches may be input to the body system control unit 12020. The body system control unit 12020 receives inputs of the radio waves or signals and controls a door lock device, a power window device, and a lamp of the vehicle.

The vehicle external information detection unit 12030 detects information on the outside of the vehicle having the vehicle control system 12000 mounted thereon. For example, an imaging unit 12031 is connected to the vehicle external information detection unit 12030. The vehicle external information detection unit 12030 causes the imaging unit 12031 to capture an image of the outside of the vehicle and receives the captured image. The vehicle external information detection unit 12030 may perform object detection processing or distance detection processing for people, cars, obstacles, signs, and letters on the road on the basis of the received image.

The imaging unit 12031 is an optical sensor that receives light and outputs an electrical signal in accordance with an amount of the received light. The imaging unit 12031 can also output the electrical signal as an image or ranging information. In addition, the light received by the imaging unit 12031 may be visible light or invisible light such as infrared light.

The vehicle internal information detection unit 12040 detects information on the inside of the vehicle. For example, a driver state detection unit 12041 that detects a driver's state is connected to the vehicle internal information detection unit 12040. The driver state detection unit 12041 includes, for example, a camera that captures an image of the driver, and the vehicle internal information detection unit 12040 may calculate a degree of fatigue or concentration of the driver or may determine whether or not the driver is dozing on the basis of detection information input from the driver state detection unit 12041.

The microcomputer 12051 can calculate a control target value of the driving force generation device, the steering mechanism, or the braking device on the basis of information on the inside or the outside of the vehicle acquired by the vehicle external information detection unit 12030 or the vehicle internal information detection unit 12040, and can output a control command to the drive system control unit 12010. For example, the microcomputer 12051 can perform cooperative control for the purpose of implementing functions of an advanced driver assistance system (ADAS) including vehicle collision avoidance, impact mitigation, following traveling based on an inter-vehicle distance, vehicle speed maintenance driving, vehicle collision warning, and vehicle lane deviation warning.

Further, the microcomputer 12051 can perform cooperative control for the purpose of automated driving or the like in which autonomous travel is performed without depending on operations of the driver, by controlling the driving force generation device, the steering mechanism, or the braking device and the like on the basis of information around the vehicle acquired by the vehicle external information detection unit 12030 or the vehicle internal information detection unit 12040.

In addition, the microcomputer 12051 can output a control command to the body system control unit 12020 on the basis of information on the outside of the vehicle acquired by the vehicle external information detection unit 12030. For example, the microcomputer 12051 can perform cooperative control for the purpose of preventing glare, such as switching from a high beam to a low beam, by controlling the headlamp in accordance with a position of a preceding vehicle or an oncoming vehicle detected by the vehicle external information detection unit 12030.

The audio and image output unit 12052 transmits an output signal of at least one of an audio and an image to an output device capable of visually or audibly notifying a passenger or the outside of the vehicle of information. In the example of FIG. 10, an audio speaker 12061, a display unit 12062, and an instrument panel 12063 are illustrated as examples of the output device. The display unit 12062 may include at least one of an on-board display and a head-up display, for example.

Figure 11:
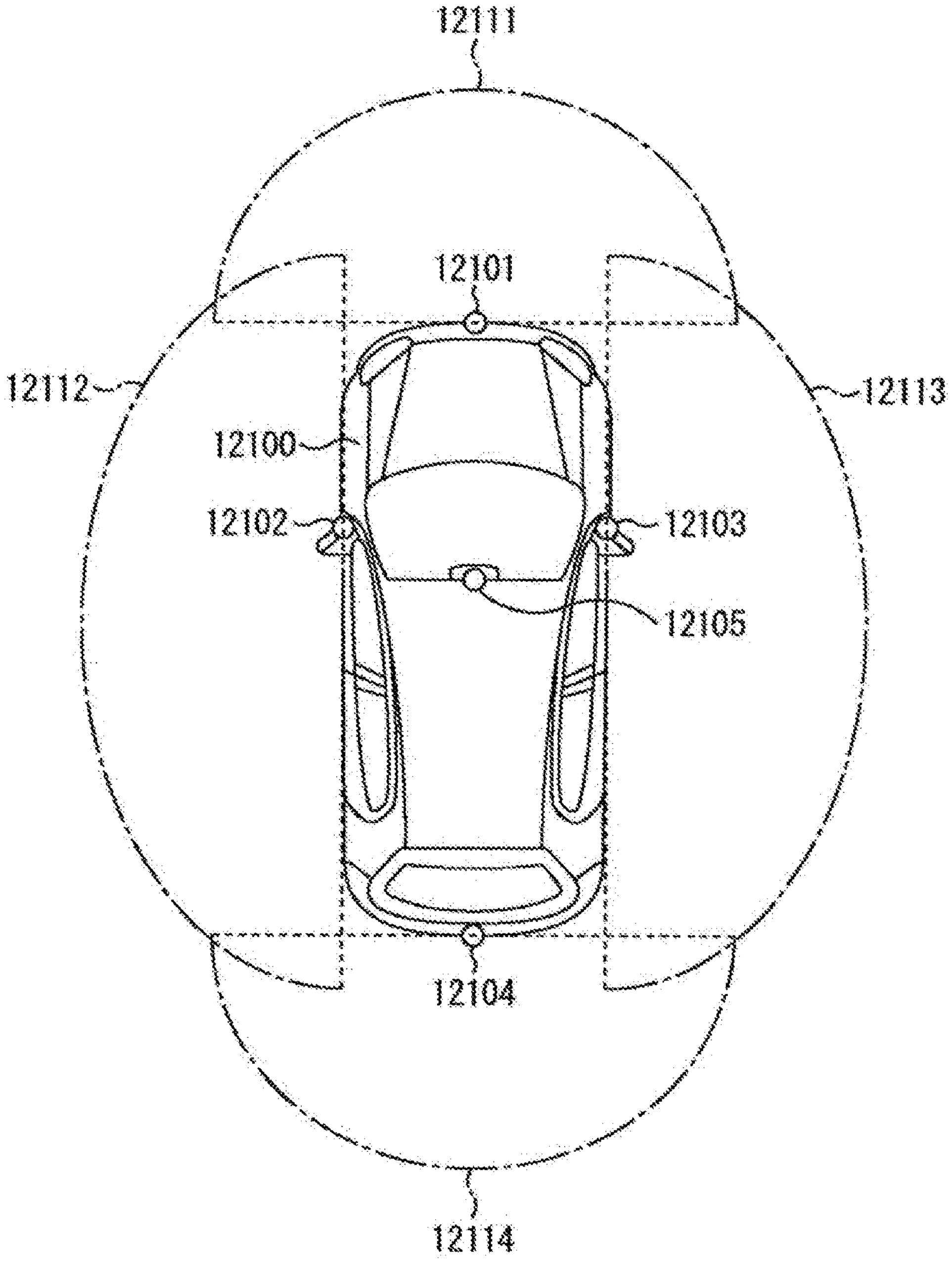
FIG. 11 is an explanatory diagram showing an example of installation positions of a vehicle external information detection unit and an imaging unit.

FIG. 11 is a diagram showing an example of an installation position of the imaging unit 12031.

In FIG. 11, a vehicle 12100 includes imaging units 12101, 12102, 12103, 12104, and 12105 as the imaging unit 12031.

The imaging units 12101, 12102, 12103, 12104, and 12105 are provided at positions such as a front nose, side-view mirrors, a rear bumper, a back door, and an upper portion of a windshield in a vehicle interior of the vehicle 12100, for example. The imaging unit 12101 provided on the front nose and the imaging unit 12105 provided in the upper portion of the windshield in the vehicle interior mainly acquire images of the front of the vehicle 12100. The imaging units 12102 and 12103 provided on the side-view mirrors mainly acquire images of a lateral side of the vehicle 12100. The imaging unit 12104 provided on the rear bumper or the back door mainly acquires images of the rear of the vehicle 12100. Front view images acquired by the imaging units 12101 and 12105 are mainly used for detection of preceding vehicles, pedestrians, obstacles, traffic lights, traffic signs, lanes, and the like.

FIG. 11 shows an example of imaging ranges of the imaging units 12101 to 12104. An imaging range 12111 indicates an imaging range of the imaging unit 12101 provided at the front nose, imaging ranges 12112 and 12113 respectively indicate imaging ranges of the imaging units 12102 and 12103 provided at the side-view mirrors, and an imaging range 12114 indicates an imaging range of the imaging unit 12104 provided at the rear bumper or the back door. For example, by superimposing image data captured by the imaging units 12101 to 12104, it is possible to obtain a bird's-eye view image of the vehicle 12100 viewed from above.

At least one of the imaging units 12101 to 12104 may have a function for obtaining distance information. For example, at least one of the imaging units 12101 to 12104 may be a stereo camera configured of a plurality of imaging elements or may be an imaging element having pixels for phase difference detection.

For example, the microcomputer 12051 can extract, particularly, the closest three-dimensional object on a path through which the vehicle 12100 is traveling, which is a three-dimensional object traveling at a predetermined speed (for example, 0 km/h or higher) in substantially the same direction as the vehicle 12100, as a preceding vehicle by acquiring a distance to each three-dimensional object in the imaging ranges 12111 to 12114 and a change in the distance by lapse of time (a relative speed with respect to the vehicle 12100) on the basis of distance information obtained from the imaging units 12101 to 12104. Furthermore, the microcomputer 12051 can set an inter-vehicle distance to be secured in advance with a preceding vehicle and can perform automated brake control (also including following stop control) or automated acceleration control (also including following start control). This can perform cooperative control for the purpose of, for example, automated driving in which the vehicle autonomously travels without the need for the driver's operations.

For example, the microcomputer 12051 can classify and extract three-dimensional data regarding three-dimensional objects into two-wheeled vehicles, normal vehicles, large vehicles, pedestrians, and other three-dimensional objects such as electric poles on the basis of distance information obtained from the imaging units 12101 to 12104 and can use the three-dimensional data to perform automated avoidance from obstacles. For example, the microcomputer 12051 differentiates obstacles around the vehicle 12100 into obstacles which can be viewed by the driver of the vehicle 12100 and obstacles which are difficult to view. Then, the microcomputer 12051 determines a collision risk indicating a degree of risk of collision with each obstacle, and when the collision risk is equal to or higher than a set value and there is a possibility of collision, it outputs an alarm to the driver via the audio speaker 12061 and the display unit 12062 and performs forced deceleration and avoidance steering via the drive system control unit 12010, thereby perform driving assistance for collision avoidance.

At least one of the imaging units 12101 to 12104 may be an infrared camera that detects infrared rays. For example, the microcomputer 12051 can recognize a pedestrian by determining whether or not there is a pedestrian in the captured images of the imaging units 12101 to 12104. Such a recognition of the pedestrian is performed by, for example, a procedure for extracting feature points in the captured images of the imaging units 12101 to 12104 as infrared cameras and a procedure for determining whether there is a pedestrian or not by performing pattern matching processing on a series of feature points indicating an outline of an object. When the microcomputer 12051 determines that there is a pedestrian in the captured images of the imaging units 12101 to 12104 and the pedestrian is recognized, the audio and image output unit 12052 controls the display unit 12062 such that a square contour line for emphasis is superimposed and displayed with the recognized pedestrian. In addition, the audio and image output unit 12052 may control the display unit 12062 such that an icon indicating a pedestrian or the like is displayed at a desired position.

The examples of the vehicle control system to which the technique according to the present disclosure can be applied have been described above. The technique according to the present disclosure can be applied, for example, to the imaging unit 12031 among the configurations described above. Specifically, the imaging element according to the present disclosure can be mounted in the imaging unit 12031. By applying the technique according to the present disclosure to the imaging unit 12031, it is possible to improve resolutions of the distance images while inhibiting generation of electromagnetic noises, and to enhance functionality and safety of the vehicle 12100.

Also, the present technique can also adopt the following configurations.

(1) A light-emitting device including: a first substrate that outputs a drive signal for driving a light-emitting element; and a second substrate that is laminated on the first substrate and includes the light-emitting element, wherein a first surface side of the first substrate includes:

a first pad that supplies the drive signal to the light-emitting element;

a first conductive layer disposed on the first pad; and a bonding layer disposed on the first conductive layer, and a second surface side of the second substrate disposed to face the first surface of the first substrate includes:

the light-emitting element having a mesa shape; and a second pad that is disposed on the light-emitting element and bonded to the first pad via the bonding layer.

(2) The light-emitting device according to the above (1), wherein the second surface side of the second substrate includes a second conductive layer that is disposed on the second pad and bonded to the bonding layer.

(3) The light-emitting device according to the above (1) or (2), wherein the first conductive layer is a barrier layer for the bonding layer, and the bonding layer includes three or more metal layers sandwiching a nickel layer, or two or more metal layers including a nickel layer.

(4) A method for manufacturing a light-emitting device including: forming an insulating film on a first surface of a first substrate including a surface of a first pad that outputs a drive signal for driving a light-emitting element;

exposing an upper surface of the first pad by patterning the insulating film;

forming a first conductive layer on the insulating film and the first pad;

forming a bonding layer on the first conductive layer;

reflowing the bonding layer; and causing the first surface of the first substrate to face a second surface of a second substrate and bonding the first pad to a second pad electrically connected to an anode electrode of the light-emitting element having a mesa shape formed on the second substrate via the bonding layer.

(5) The method for manufacturing a light-emitting device according to the above (4), further including: forming a resist film on the first conductive layer after forming the first conductive layer on the first pad;

patterning the resist film such that the first conductive layer above the first pad is exposed;

forming the bonding layer on the exposed first conductive layer; and removing the resist film.

(6) The method for manufacturing a light-emitting device according to the above (5), further including removing a portion of the first conductive layer after removing the resist film, wherein the reflowing of the bonding layer is performed after removing the portion of the first conductive layer.

(7) The method for manufacturing a light-emitting device according to the above (6), wherein the removing of the portion of the first conductive layer is performed by wet etching.

(8) The method for manufacturing a light-emitting device according to any one of the above (4) to (7), wherein the first pad contains aluminum, and the first conductive layer is a laminated film of titanium and copper.

(9) The method for manufacturing a light-emitting device according to the above (8), wherein, in the forming of the first conductive layer, a metal layer containing titanium is formed on the first pad and a metal layer containing copper is formed thereon, and the bonding layer is formed on the metal layer containing copper.

(10) The method for manufacturing a light-emitting device according to any one of the above (4) to (9), wherein the bonding layer is a laminated film containing at least one of tin and copper.

(11) The method for manufacturing a light-emitting device according to any one of the above (4) to (10), wherein the bonding layer is formed of three or more metal layers sandwiching a nickel layer, or two or more metal layers including a nickel layer.

(12) The method for manufacturing a light-emitting device according to the above (11), wherein the bonding layer is formed by laminating a first metal layer containing copper on the first conductive layer, laminating a second metal layer containing nickel on the first metal layer, and laminating a third metal layer containing tin on the second metal layer.

(13) The method for manufacturing a light-emitting device according to the above (11), wherein the bonding layer is formed by laminating a first metal layer containing nickel on the first conductive layer and laminating a second metal layer containing tin on the first metal layer.

(14) The method for manufacturing a light-emitting device according to any one of the above (4) to (11), further including: forming a second conductive layer on the second pad of the second substrate; and causing the first surface of the first substrate to face the second surface of the second substrate and bonding the bonding layer of the first substrate to the second conductive layer.

(15) The method for manufacturing a light-emitting device according to the above (14), wherein a diameter size of the second conductive layer is equal to or larger than a diameter size of the bonding layer.

(16) The method for manufacturing a light-emitting device according to the above (14) or (15), wherein the first substrate is a wafer, and chip on wafer (CoW) connection is performed in the bonding of the bonding layer of the first substrate to the second conductive layer.

(17) The method for manufacturing a light-emitting device according to the above (16), wherein a plurality of the light-emitting elements having mesa shapes are formed on the second substrate, the method further includes individualizing the plurality of light-emitting elements after forming the second conductive layer, and the bonding of the bonding layer of the first substrate to the second conductive layer is performed after individualizing the plurality of light-emitting elements.

(18) The method for manufacturing a light-emitting device according to the above (17), wherein the individualizing of the plurality of light-emitting elements is performed by individualizing the plurality of light-emitting elements by stealth dicing using laser light.

(19) The method for manufacturing a light-emitting device according to any one of the above (14) to (18), further including injecting an insulating material between the first substrate and the second substrate after bonding the bonding layer of the first substrate to the second conductive layer.

Aspects of the present disclosure are not limited to the aforementioned individual embodiments and include various modifications that those skilled in the art can achieve, and effects of the present disclosure are also not limited to the details described above. In other words, various additions, modifications, and partial deletion can be made without departing from the conceptual idea and the gist of the present disclosure that can be derived from the details defined in the claims and the equivalents thereof.

REFERENCE SIGNS LIST

1 Light-emitting device
2 Mounting substrate
3 Heat dissipation substrate
4 LDD substrate
5 LD chip
6 Bonding layer
7 Correction lens
8 Lens holding unit
11 Substrate
12 Laminated film
13 Light-emitting element
14 Anode electrode (second pad)
15 Cathode electrode
21 First pad
22 First conductive layer
23 Underfill layer

24 Second conductive layer
25 First substrate
26 Insulating film
27 Photoresist
28 Insulating film
30 Ranging device
31 Ranging unit
32 Light-receiving device
33 Light-emitting unit
34 Drive circuit
35 Power supply circuit
36 Light-emitting side optical system
37 Image sensor
38 Image processing unit
39 Imaging side optical system
40 Subject
41 Control device

What is claimed is:

1. A light-emitting device, comprising:
a first substrate that outputs a drive signal for driving a light-emitting element; and
a second substrate that is laminated on the first substrate and includes the light-emitting element,
wherein a first surface side of the first substrate includes:
a first pad that supplies the drive signal to the light-emitting element;
a first conductive layer disposed on the first pad; and
a bonding layer disposed directly on the first conductive layer,
wherein the bonding layer is in direct physical contact with the first conductive layer,
wherein the bonding layer includes three or more metal layers sandwiching a nickel layer, or two or more metal layers including a nickel layer, and
wherein the bonding layer comprises either:
a copper layer, a nickel layer on the copper layer, and a tin layer on the nickel layer; or
a nickel layer on the first conductive layer and a tin layer on the nickel layer, and
wherein a second surface side of the second substrate disposed to face the first surface of the first substrate includes:
the light-emitting element having a mesa shape; and
a second pad that is disposed on the light-emitting element and bonded to the first pad via the bonding layer.

2. The light-emitting device according to claim 1, wherein the second surface side of the second substrate includes a second conductive layer that is disposed on the second pad and bonded to the bonding layer.

3. The light-emitting device according to claim 1, wherein the first conductive layer is a barrier layer for the bonding layer.

4. A method for manufacturing a light-emitting device, comprising:
forming an insulating film on a first surface of a first substrate including a surface of a first pad that outputs a drive signal for driving a light-emitting element;
exposing an upper surface of the first pad by patterning the insulating film;
forming a first conductive layer on the insulating film and the first pad;
forming a bonding layer directly on the first conductive layer,
wherein the bonding layer is in direct physical contact with the first conductive layer,
wherein the bonding layer is formed of three or more metal layers sandwiching a nickel layer, or two or more metal layers including a nickel layer, and
wherein the bonding layer is formed by either:
laminating a first metal layer containing copper on the first conductive layer, laminating a second metal layer containing nickel on the first metal layer, and laminating a third metal layer containing tin on the second metal layer; or
laminating a first metal layer containing nickel on the first conductive layer and laminating a second metal layer containing tin on the first metal layer;
reflowing the bonding layer; and
causing the first surface of the first substrate to face a second surface of a second substrate and bonding the first pad to a second pad electrically connected to an anode electrode of the light-emitting element having a mesa shape formed on the second substrate via the bonding layer.

5. The method for manufacturing a light-emitting device according to claim 4, further comprising: forming a resist film on the first conductive layer after forming the first conductive layer on the first pad;
patterning the resist film such that the first conductive layer above the first pad is exposed;
forming the bonding layer on the exposed first conductive layer; and
removing the resist film.

6. The method for manufacturing a light-emitting device according to claim 5, further comprising removing a portion of the first conductive layer after removing the resist film,
wherein the reflowing of the bonding layer is performed after removing the portion of the first conductive layer.

7. The method for manufacturing a light-emitting device according to claim 6, wherein the removing of the portion of the first conductive layer is performed by wet etching.

8. The method for manufacturing a light-emitting device according to claim 4, wherein the first pad contains aluminum, and
the first conductive layer is a laminated film of titanium and copper.

9. The method for manufacturing a light-emitting device according to claim 8, wherein, in the forming of the first conductive layer, a metal layer containing titanium is formed on the first pad and a metal layer containing copper is formed thereon, and
the bonding layer is formed on the metal layer containing copper.

10. The method for manufacturing a light-emitting device according to claim 4, wherein the bonding layer is a laminated film containing at least one of tin and copper.

11. The method for manufacturing a light-emitting device according to claim 4, further comprising: forming a second conductive layer on the second pad of the second substrate; and
causing the first surface of the first substrate to face the second surface of the second substrate and bonding the bonding layer of the first substrate to the second conductive layer.

12. The method for manufacturing a light-emitting device according to claim 11, wherein a diameter size of the second conductive layer is equal to or larger than a diameter size of the bonding layer.

13. The method for manufacturing a light-emitting device according to claim 11, wherein the first substrate is a wafer, and
chip on wafer (CoW) connection is performed in the bonding of the bonding layer of the first substrate to the second conductive layer.

14. The method for manufacturing a light-emitting device according to claim 13, wherein a plurality of the light-emitting elements having mesa shapes are formed on the second substrate, the method further includes individualizing the plurality of light-emitting elements after forming the second conductive layer, and the bonding of the bonding layer of the first substrate to the second conductive layer is performed after individualizing the plurality of light-emitting elements.

15. The method for manufacturing a light-emitting device according to claim 14, wherein the individualizing of the plurality of light-emitting elements is performed by individualizing the plurality of light-emitting elements by stealth dicing using laser light.

16. The method for manufacturing a light-emitting device according to claim 11, further comprising injecting an insulating material between the first substrate and the second substrate after bonding the bonding layer of the first substrate to the second conductive layer.

17. A method for manufacturing a light-emitting device, comprising:

forming an insulating film on a first surface of a first substrate including a surface of a first pad that outputs a drive signal for driving a light-emitting element;

exposing an upper surface of the first pad by patterning the insulating film;

forming a first conductive layer on the insulating film and the first pad;

forming a bonding layer on the first conductive layer;

reflowing the bonding layer;

causing the first surface of the first substrate to face a second surface of a second substrate and bonding the first pad to a second pad electrically connected to an anode electrode of the light-emitting element having a mesa shape formed on the second substrate via the bonding layer;

forming a second conductive layer on the second pad of the second substrate;

causing the first surface of the first substrate to face the second surface of the second substrate and bonding the bonding layer of the first substrate to the second conductive layer;

forming a plurality of the light-emitting elements having mesa shapes on the second substrate;

individualizing the plurality of light-emitting elements after forming the second conductive layer; and performing the bonding of the bonding layer of the first substrate to the second conductive layer after individualizing the plurality of light-emitting elements.

18. The method for manufacturing a light-emitting device according to claim 17, wherein the bonding layer is formed of three or more metal layers sandwiching a nickel layer, or two or more metal layers including a nickel layer.

19. The method for manufacturing a light-emitting device according to claim 18, wherein the bonding layer is formed by laminating a first metal layer containing copper on the first conductive layer, laminating a second metal layer containing nickel on the first metal layer, and laminating a third metal layer containing tin on the second metal layer.

20. The method for manufacturing a light-emitting device according to claim 18, wherein the bonding layer is formed by laminating a first metal layer containing nickel on the first conductive layer and laminating a second metal layer containing tin on the first metal layer.

* * * * *